United States Patent
Shen

(10) Patent No.: US 10,016,857 B2
(45) Date of Patent: Jul. 10, 2018

(54) METHOD OF REMOVING INEFFECTIVE PORTION OF FLAT HEAT PIPE

(71) Applicant: ASIA VITAL COMPONENTS CO., LTD., New Taipei (TW)

(72) Inventor: Ching-Hang Shen, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 690 days.

(21) Appl. No.: 14/612,209

(22) Filed: Feb. 2, 2015

(65) Prior Publication Data

US 2016/0221131 A1    Aug. 4, 2016

(51) Int. Cl.
*B23P 15/26* (2006.01)
*F28D 15/02* (2006.01)
*F28D 15/04* (2006.01)
*B23P 6/00* (2006.01)
*H01L 23/427* (2006.01)

(52) U.S. Cl.
CPC .......... *B23P 15/26* (2013.01); *F28D 15/0283* (2013.01); *F28D 15/04* (2013.01); *B23P 6/00* (2013.01); *B23P 2700/09* (2013.01); *F28F 2255/08* (2013.01); *F28F 2275/06* (2013.01); *H01L 23/427* (2013.01)

(58) Field of Classification Search
CPC .......... Y10T 29/4935; Y10T 29/49353; Y10T 29/49366; Y10T 29/494; B21D 53/06
USPC .......... 228/155, 159, 160
See application file for complete search history.

(56) References Cited

U.S. PATENT DOCUMENTS

| | | | | |
|---|---|---|---|---|
| 2,469,975 A | * | 5/1949 | McCloy | B65B 9/12 219/91.23 |
| 3,454,468 A | * | 7/1969 | Franco-Ferreira | G21C 3/33 144/34.1 |
| 2007/0062038 A1 | * | 3/2007 | Hou | B23P 15/26 29/890.032 |
| 2012/0305223 A1 | * | 12/2012 | Yang | F28D 15/046 165/104.26 |

* cited by examiner

*Primary Examiner* — Jason L Vaughan
*Assistant Examiner* — Amanda Meneghini
(74) *Attorney, Agent, or Firm* — Jackson IPG PLLC; Demian K. Jackson

(57) ABSTRACT

A method of removing ineffective portion of flat heat pipe is disclosed. The method includes the steps of providing a flat heat pipe; flattening out at least one wick-free flatten-out zone of the flat heat pipe and then sealing the flattened flatten-out zone by welding; and cutting off a cut-away section but reserving a remainder section of the flattened and sealed flatten-out zone, so that an ineffective portion is removed from the flat heat pipe. After being processed with the above method, the flat heat pipe can have effectively increased heat transfer efficiency and save a lot of space.

4 Claims, 16 Drawing Sheets

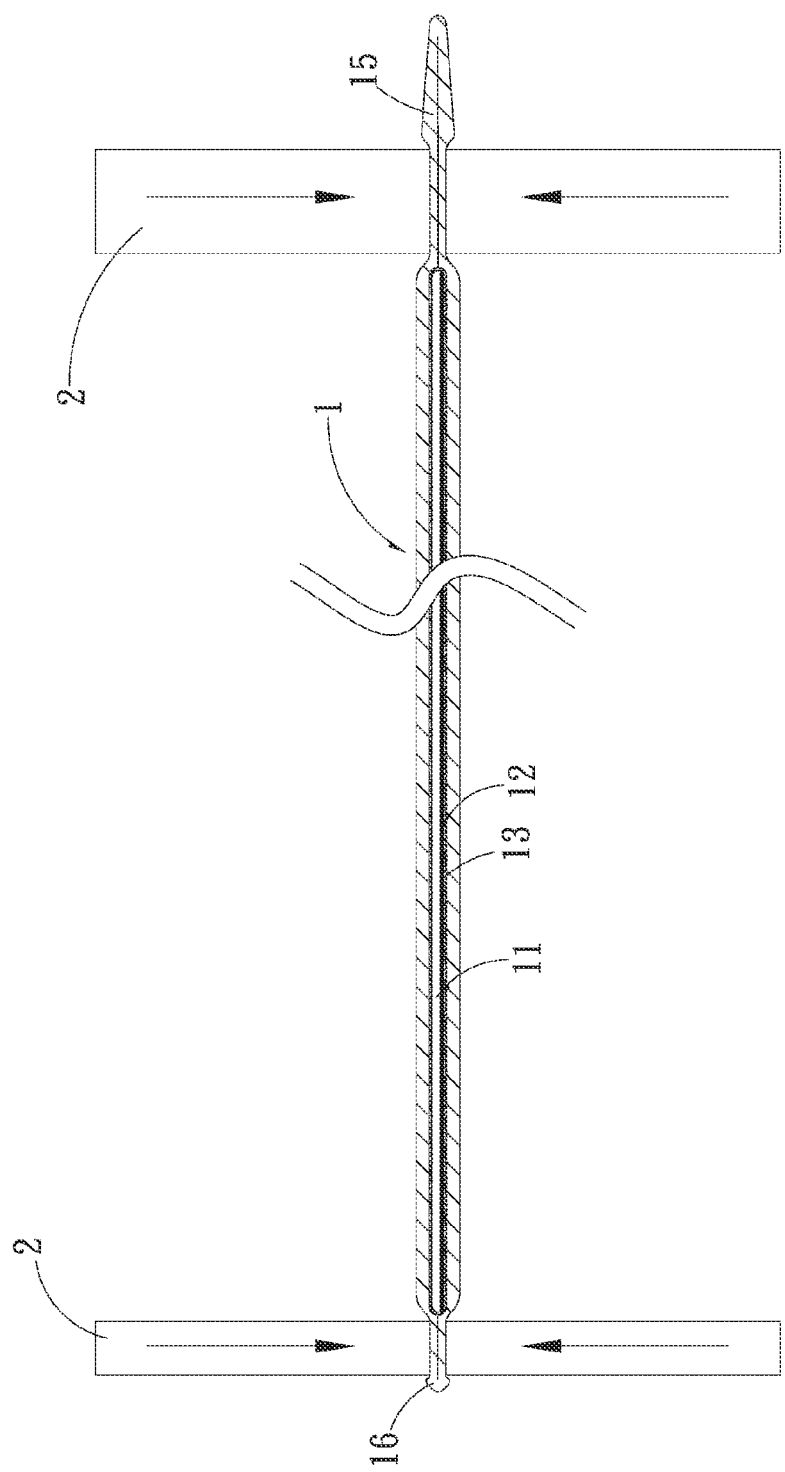

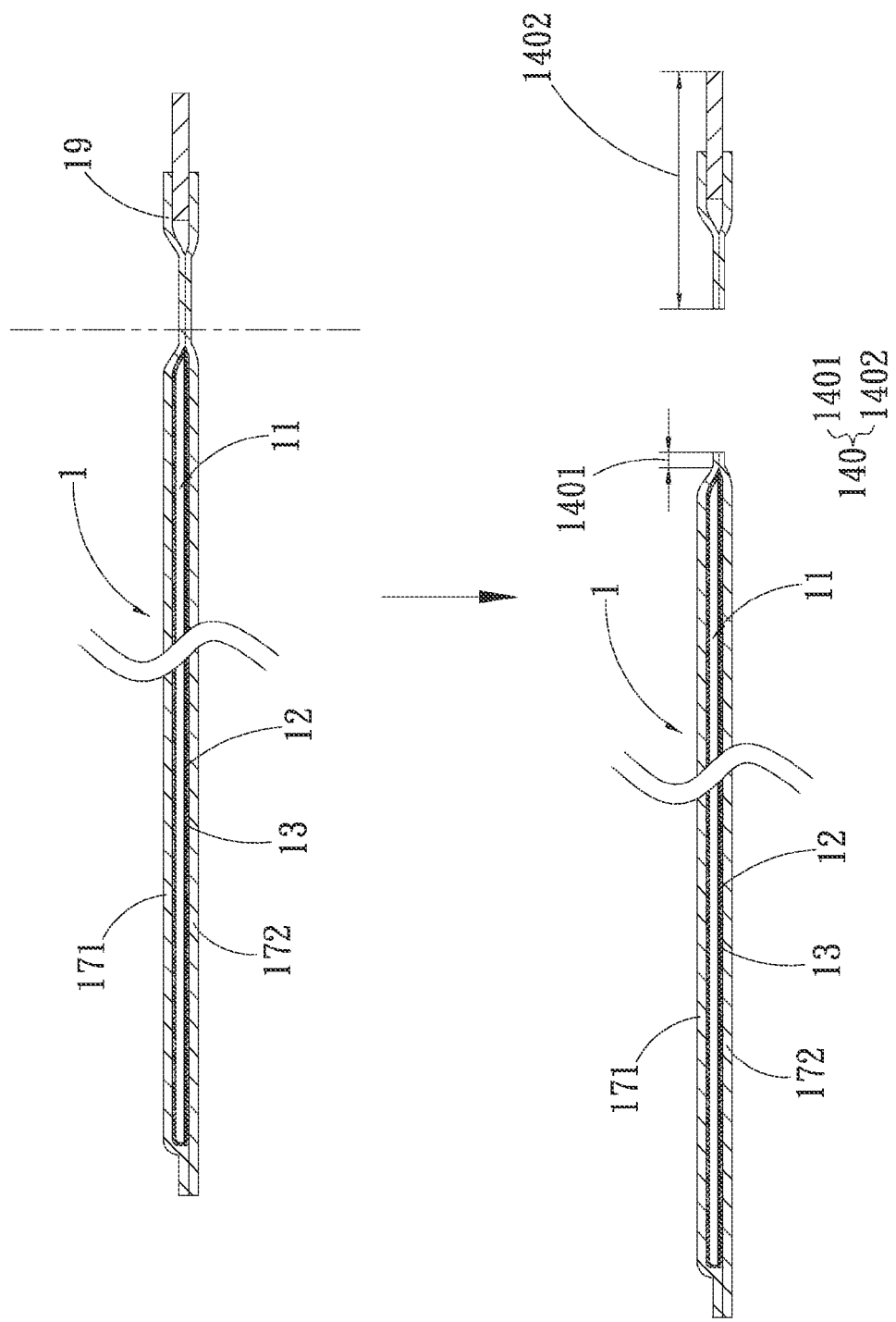

METHOD OF REMOVING INEFFECTIVE PORTION OF FLAT HEAT PIPE

FIELD OF THE INVENTION

The present invention relates to a flat heat pipe, and more specifically, to a method of removing ineffective portion of flat heat pipe that enables a flat heat pipe to have increased heat transfer efficiency and effectively save a lot of space.

BACKGROUND OF THE INVENTION

As the advancement of the electronic information industry, various electronic elements, such as central processing units (CPUs), now have higher performance but also produce more heat during operation thereof. A thermal module composed of heat radiating fins and cooling fans is no longer sufficient for effectively dissipating the large amount of heat generated by the high-performance electronic elements. Currently, a heat pipe is a key element being widely used particularly in notebook computers, tablet PCs, smart watches, wearable smart devices and the like for heat transfer. The heat pipe is a passive heat transfer element with excellent heat transfer efficiency. With the two-phase conversion between vapor and liquid inside it, the heat pipe has heat transfer ability several hundred times higher than that of copper of the same size. When being used to transfer heat, the heat pipe has the advantages of fast response and low thermal resistance. Therefore, various high-performance thermal modules are developed by incorporating heat pipes and other relevant products thereinto for suitably solving the heat dissipation problem of the high-performance electronic products.

The conventional method for sealing a heat pipe includes the steps of sealing one end of the heat pipe; evacuating the heat pipe via an opposite open end thereof before filling a working fluid into the heat pipe via the open end; drawing and reducing the open end to form a reducing section; and sealing the reducing section of the heat pipe by argon welding. Since the reducing section of the conventional heat pipe does not provide the heat transfer function, it becomes an ineffective portion to adversely affect the heat transfer efficiency of the heat pipe. Moreover, the sealed reducing section must be long enough to prevent the heat pipe from leaking. However, the long reducing section, i.e. the ineffective portion, not only shortens the effective length of the heat pipe for heat transfer, but also occupies a lot of space particularly when the heat pipe is mounted in a smart mobile device, such as a smart watch or a smartphones, disadvantageously preventing the smart mobile device from being further reduced in dimensions.

It is therefore tried by the inventor to develop an improved method for removing the ineffective portion from the heat pipe, allowing the heat pipe to have increased heat transfer efficiency and occupy less space.

SUMMARY OF THE INVENTION

To solve the above problems, a primary object of the present invention is to provide a method of removing ineffective portion of flat heat pipe that enables a flat heat pipe to have a shortened ineffective portion and increased heat transfer efficiency.

Another object of the present invention is to provide a method of removing ineffective portion of flat heat pipe that enables the flat heat pipe to be space-saving.

To achieve the above and other objects, the method of removing ineffective portion of flat heat pipe provided according to the present invention includes the steps of providing a flat heat pipe, which internally defines a vacuum chamber filled with a working fluid and having at least one wick structure formed on an inner wall surface thereof; flattening out at least one wick-free flatten-out zone of the flat heat pipe that has a remainder section and a cut-away section, and then sealing the flattened flatten-out zone by welding; and cutting off the cut-away section but reserving the remainder section of the flattened and sealed flatten-out zone, so that an ineffective portion is removed from the flat heat pipe. After being processed with the method according to the present invention, the flat heat pipe can have largely shortened ineffective portion to have increased heat transfer efficiency and occupy less space.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 6C shows the flat heat pipe of FIG. 6B after the ineffective portions are flattened out;

FIG. 10C shows the flat heat pipe of FIG. 10B is cut to remove a cut-away section therefrom.

DETAILED DESCRIPTION OF THE PREFERRED EMBODIMENTS

Figure 1:
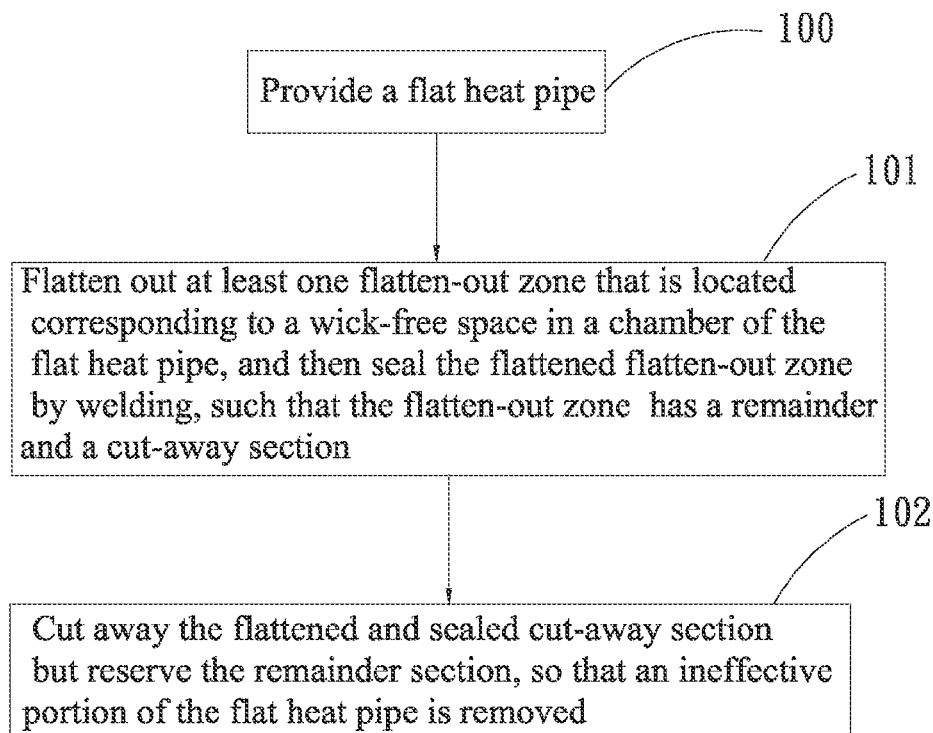
FIG. 1 is a flowchart showing the steps included in a method of removing ineffective portion of flat heat pipe according to a first preferred embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2A:
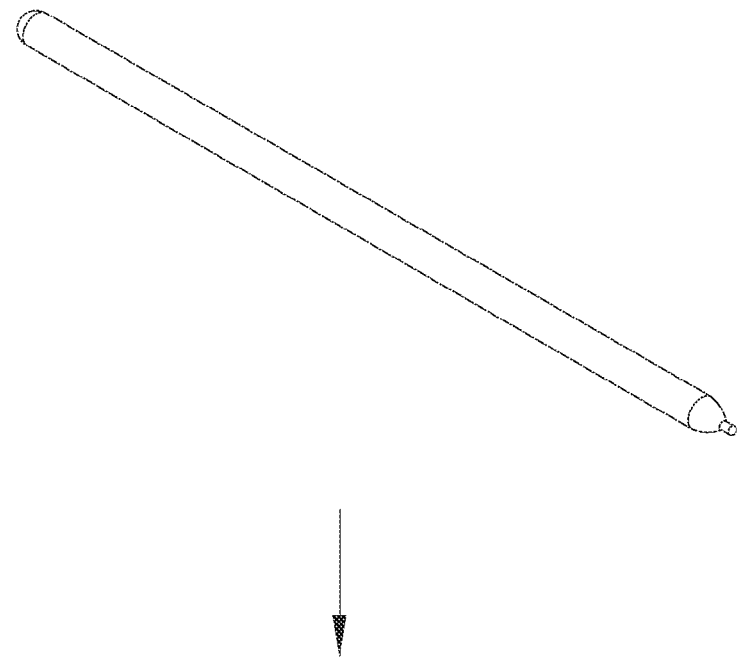
FIG. 2A is a perspective view showing a round heat pipe is flattened to provide a flat heat pipe according to the method of FIG. 1.
Figure 2A:
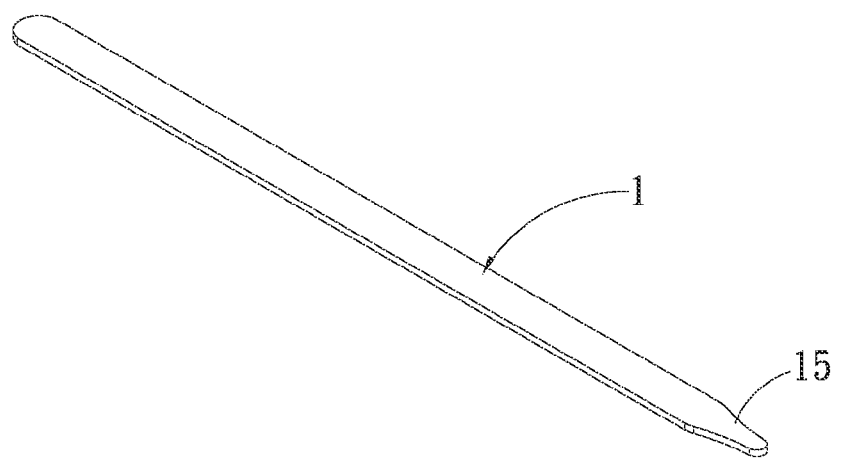
Figure 2B:
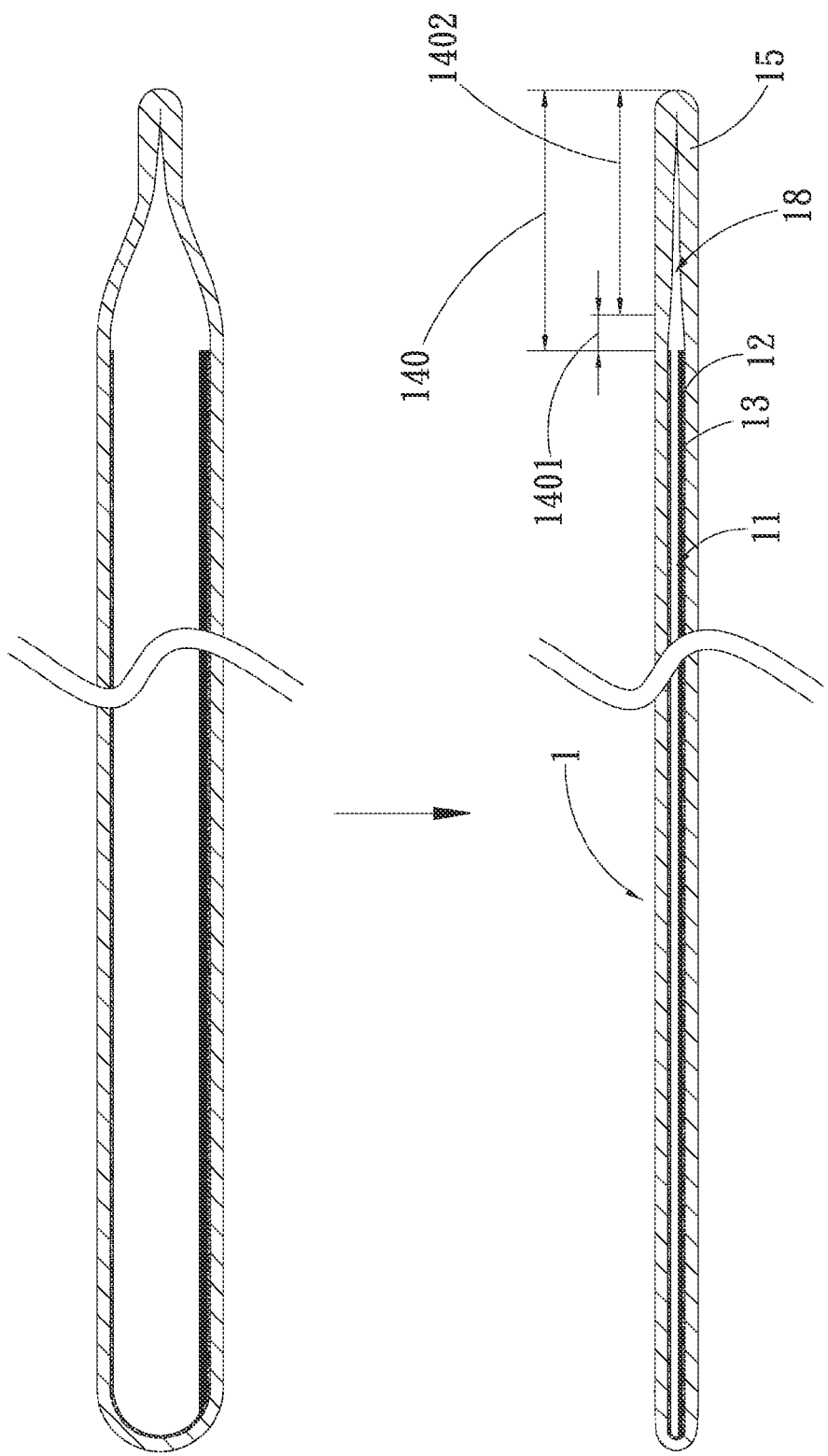
FIG. 2B is a sectional view of FIG. 2A.

The present invention provides a method of removing ineffective portion of flat heat pipe. Please refer to FIGS. 1, 2A, 2B, 3A, 3B and 4, wherein. FIG. 1 is a flowchart showing the steps 100, 101 and 102 included in the method according to a first preferred embodiment of the present invention, FIGS. 2A and 2B are perspective and sectional views, respectively, showing a round heat pipe is flattened to provide a flat heat pipe according to the method of FIG. 1, and FIGS. 3A, 3B and 4 are pictorial description of the method of FIG. 1. As shown, in the illustrated first preferred embodiment, a round heat pipe is flattened out to form a flat heat pipe 1.

In the step 100, a flat heat pipe 1 is provided. The flat heat pipe 1 internally defines a vacuum chamber 11, which is filled with a working fluid 12 and has at least one wick structure 13 formed on an inner wall surface thereof.

More specifically, in the step 100, a round heat pipe is flattened out to provide a flat heat pipe 1, as shown in FIGS. 2A and 2B. The flat heat pipe 1 internally defines a vacuum chamber 11, which is filled with a working fluid 12, such as pure water, an inorganic compound, alcohols, ketones, a liquid metal, a refrigerant or an organic compound, and has at least one wick structure 13 formed on an inner wall surface thereof. In the illustrated first preferred embodiment, the wick structure 13 can be, but not limited to, a sintered powder structure. In practical implementation, the wick structure 13 can be grooves, metal meshes, fiber woven bundles, or fiber woven nets. A wick-free space 18 is defined in the flat heat pipe 1 between the wick structure 13 provided on the inner wall surface of the flat heat pipe 1 and one end of the flat heat pipe 1. The wick-free space 18 is not provided with any wick structure to facilitate easy filling of the working fluid 12 into the chamber 11 via the wick-free space 18. Therefore, the wick-free space 18 of the flat heat pipe 1 does not function to transfer heat.

In the step 101, a flatten-out zone 140 defined on the flat heat pipe 1 is flattened out and then sealed by welding, such that the flatten-out zone 140 has a remainder section 1401 and a cut-away section 1402.

Figure 3A:
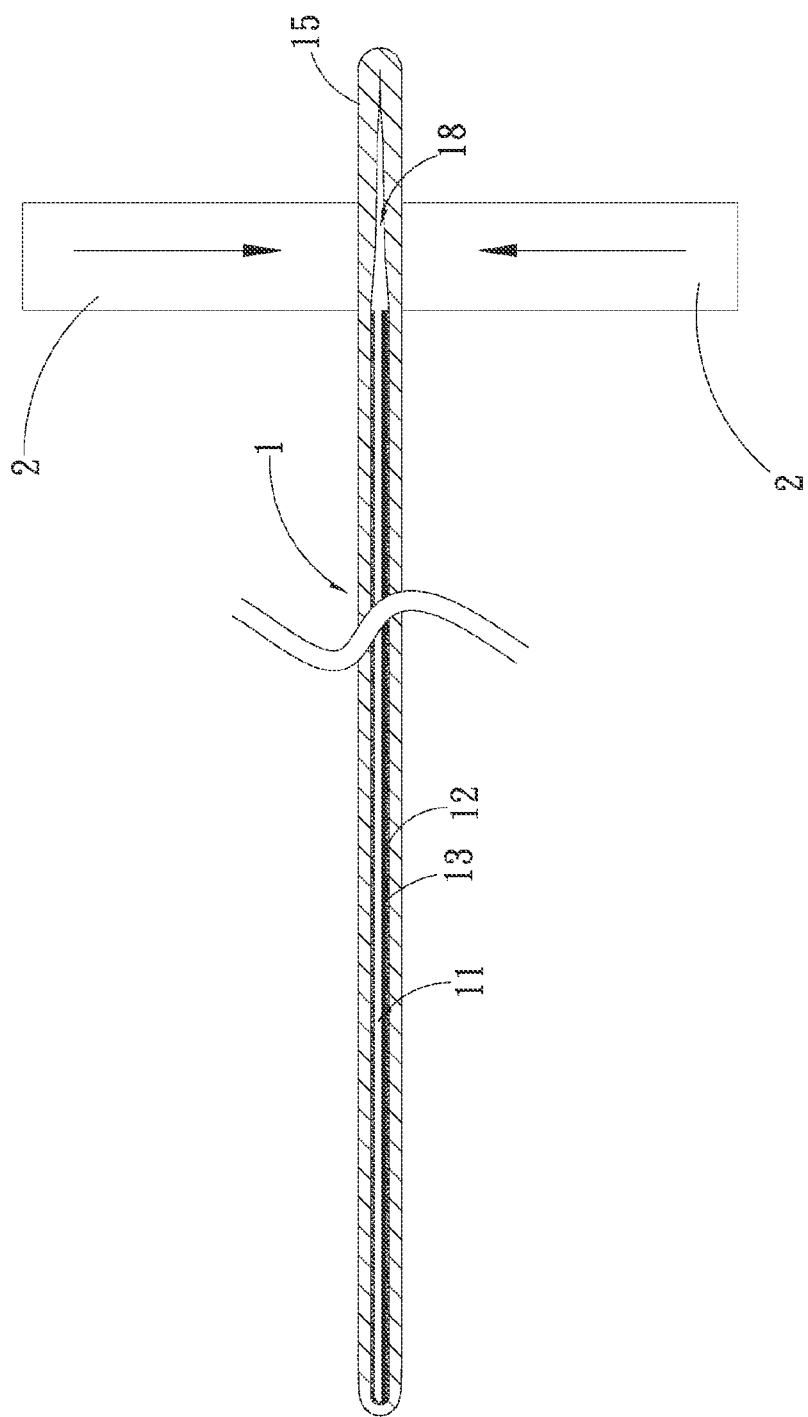
FIG. 3A shows the flat heat pipe of FIG. 2B before an ineffective portion thereof is flattened out.
Figure 3B:
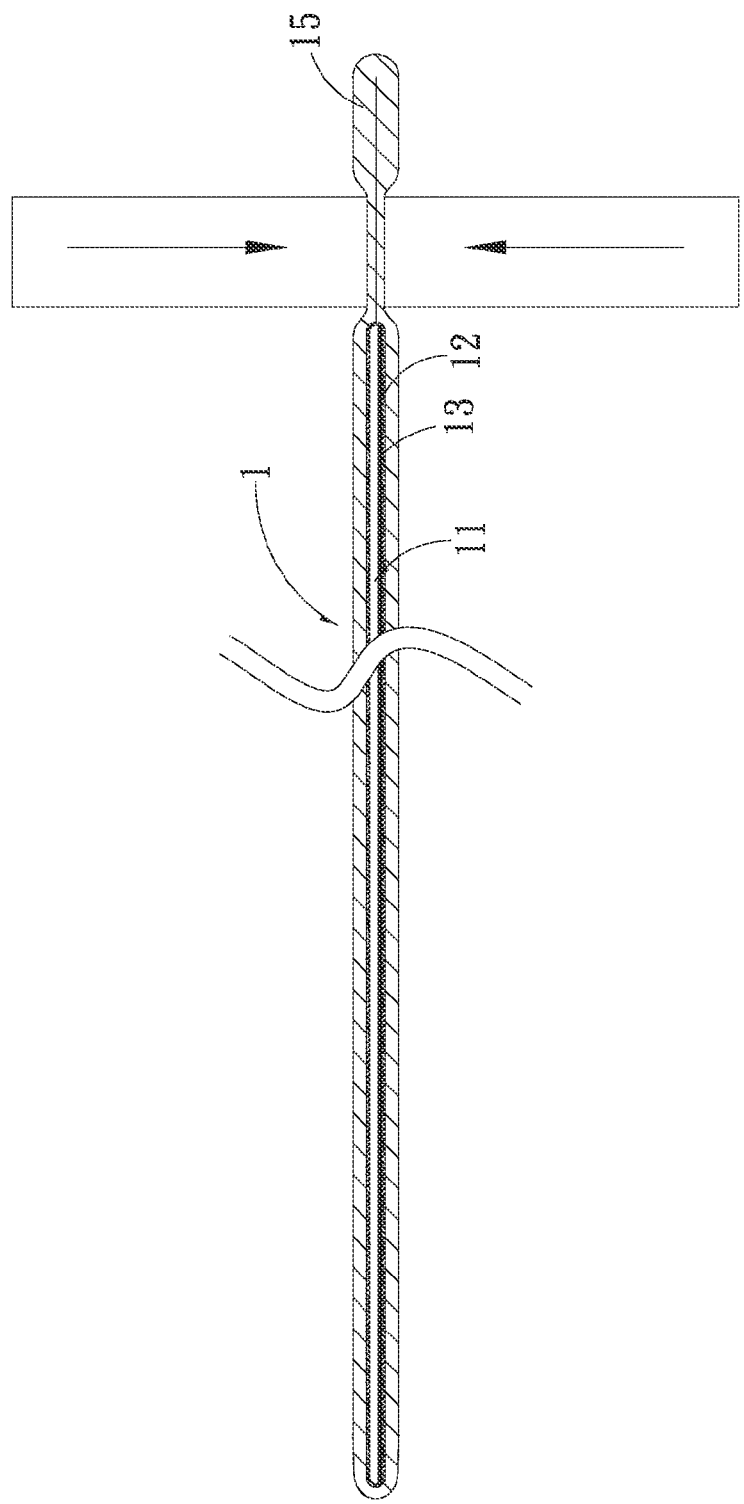
FIG. 3B shows the flat heat pipe of FIG. 3A after the ineffective portion is flattened out.

More specifically, the flat heat pipe 1 has a flatten-out zone 140 defined thereon and a portion of the chamber 11 corresponding to the flatten-out zone 140 has not any wick structure provided therein and is defined as a wick-free space 18. The flatten-out zone 140 includes a remainder section 1401 and a cut-away section 1402. In the illustrated first preferred embodiment, the flatten-out zone 140 is a portion of the flat heat pipe 1 that does not provide the function of heat transfer, and is normally referred to as an ineffective portion of the flat heat pipe 1. The flatten-out zone 140 is located corresponding to the wick-free space 18 of the chamber 11 and an end of the flat heat pipe 1 that is gradually outward reduced and sealed to form a reducing section 15. The remainder section 1401 corresponds to a section of the wick-free space 18 that is located adjacent to the wick structure 13, whereas the cut-away section 1402 corresponds to the reducing section 15 and another section of the wick-free space 18 that is located beyond the remainder section 1401. In the step 101, the flatten-out zone 140 is flattened out with a flattening device 2 and then undergone a low-temperature welding, such as a low-temperature high frequency welding, to seal an inner wall surface thereof, as shown in FIGS. 3A and 3B. In the illustrated first preferred embodiment, the flatten-out zone 140 can be flattened by squeezing, rolling, brake pressing, or pressing.

In the step 102, the flattened and sealed cut-away section 1402 is cut away while the remainder section 1401 is reserved, so that a length of the ineffective portion is removed from the flat heat pipe 1.

Figure 4:
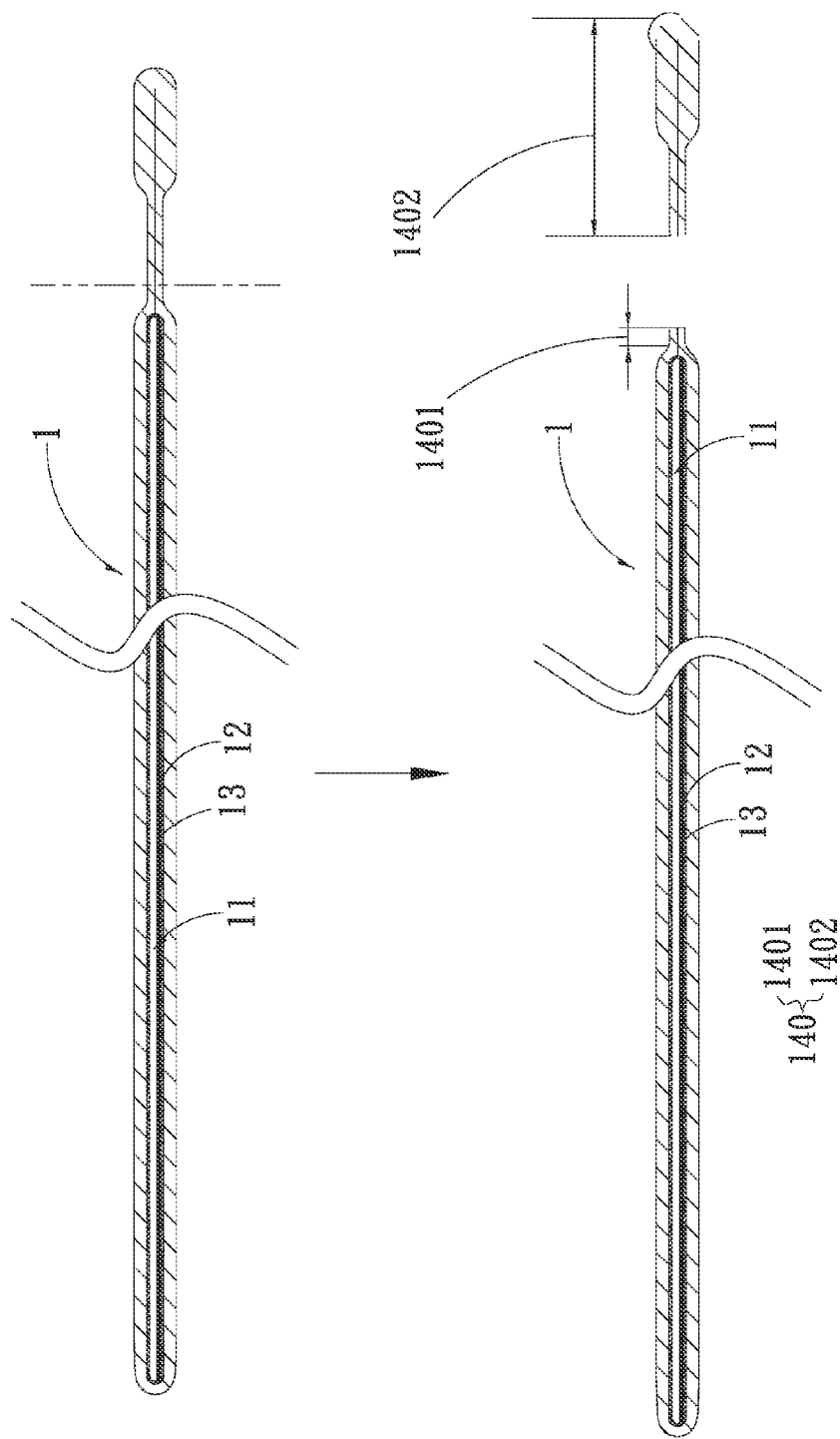
FIG. 4 shows the flat heat pipe of FIG. 3B is cut to remove a cut-away section therefrom.

More specifically, in the step 102, the flattened and sealed cut-away section 1402 is cut away but the remainder section 1401 is reserved, such that the sealed reducing section 15 without heat transfer function is cut off, as shown in FIG. 4. In other words, a surplus section of the ineffective portion, i.e. the cut-away section 1402, is removed to thereby shorten the ineffective potion of the flat heat pipe 1. Furthermore, the remainder section 1401 has a length smaller than that of the cut-away section 1402.

With the above method, the ineffective portion of the flat heat pipe 1 can be partially removed and effectively shortened, allowing the flat heat pipe 1 to have increased heat transfer efficiency. Furthermore, since the surplus section of the ineffective portion of the flat heat pipe 1 is cut away, the sealed reducing section 15 is removed to effectively shorten the ineffective portion, allowing the flat heat pipe 1 to have reduced length, volume and height. Therefore, the flat heat pipe 1 processed with the method of the present invention can save a lot of space and is suitable for use in a smart mobile device, such as a smart watch, a smartphone, a tablet PC or other smart devices, to advantageously allow further reduction of the whole volume of the smart mobile device.

Figure 5:
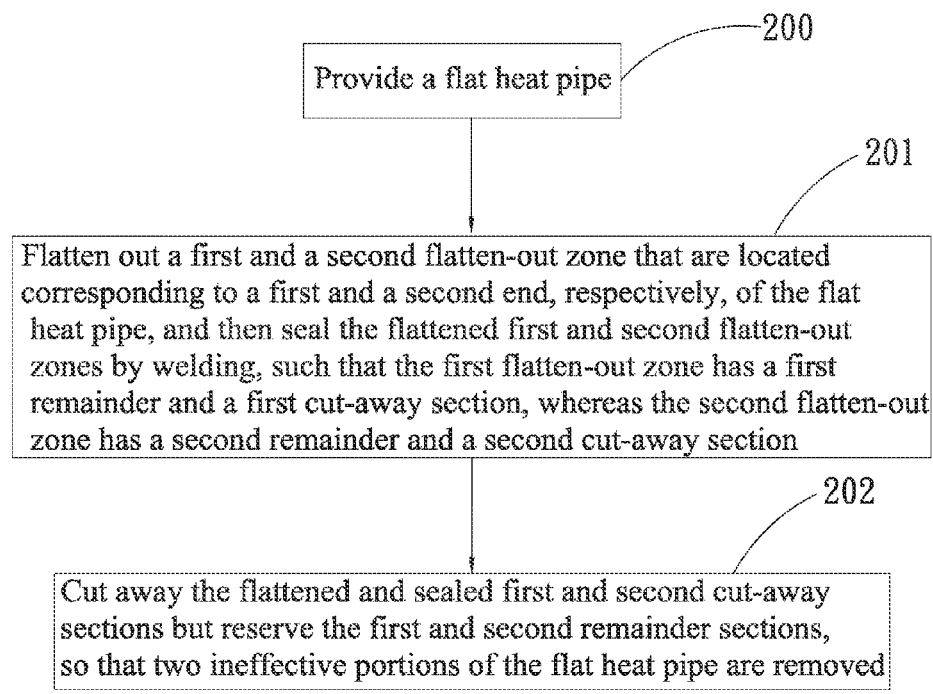
FIG. 5 is a flowchart showing the steps included in the method according to a second preferred embodiment of the present invention.
Figure 6A:
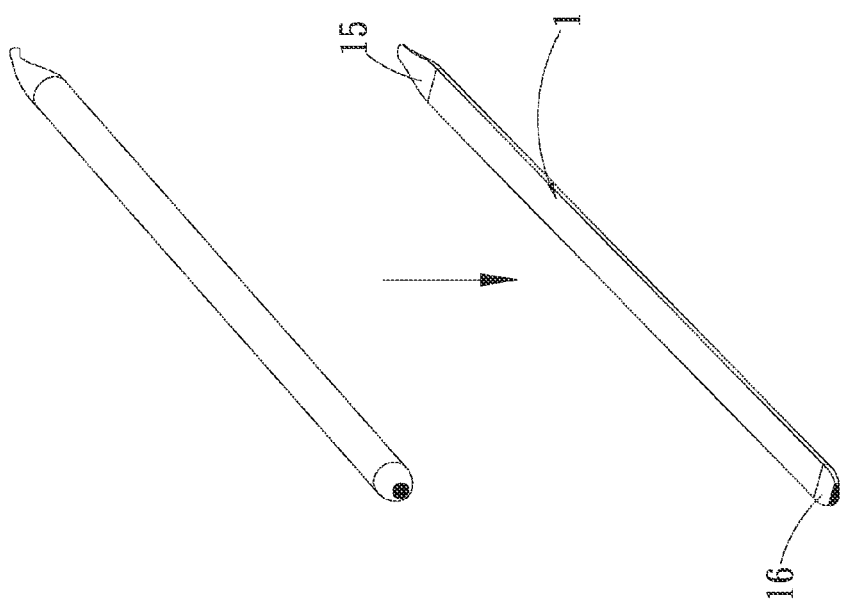
FIG. 6A is a perspective view showing a round heat pipe is flattened to provide a flat heat pipe according to the method of FIG. 5.

Please refer to FIGS. 5, 6A, 6B, 6C and 7, wherein FIG. 5 is a flowchart showing the steps 200, 201 and 202 included in the method according to a second preferred embodiment of the present invention, FIG. 6A is a perspective view showing a round heat pipe is flattened to provide a flat heat pipe according to the method of FIG. 5, and FIGS. 6B, 6C and 7 are pictorial description of the method of FIG. 5. While the flat heat pipe 1 in the first preferred embodiment has one ineffective portion to be removed therefrom, there are two ineffective portions to be removed from the flat heat pipe 1 in the second preferred embodiment.

In the step 200, a flat heat pipe 1 is provided. The flat heat pipe 1 internally defines a vacuum chamber 11, which is filled with a working fluid 12 and has at least one wick structure 13 formed on an inner wall surface thereof.

More specifically, in the step 200, a round heat pipe is flattened out to provide a flat heat pipe 1, as shown in FIG. 6A. The flat heat pipe 1 internally defines a vacuum chamber 11, which is filled with a working fluid 12, such as pure water, an inorganic compound, alcohols, ketones, a liquid metal, a refrigerant or an organic compound, and has at least one wick structure 13 formed on an inner wall surface thereof. In the illustrated second preferred embodiment, the wick structure 13 can be, but not limited to, a sintered powder structure. In practical implementation, the wick structure 13 can be grooves or metal meshes. A first wick-free space 181 is defined in the flat heat pipe 1 between the wick structure 13 provided on the inner wall surface of the flat heat pipe 1 and a first end of the flat heat pipe 1, whereas a second wick-free space 182 is defined in the flat heat pipe 1 between the wick structure 13 provided on the inner wall surface of the flat heat pipe 1 and an opposite second end of the flat heat pipe 1. The first and the second wick-free space 181, 182 are not provided with any wick structure to facilitate easy filling of the working fluid 12 into the chamber 11 via the first and second wick-free spaces 181, 182. Therefore, the first and the second wick-free space 181, 182 of the flat heat pipe 1 do not function to transfer heat.

In the step 201, a first flatten-out zone 141 and a second flatten-out zone 142 respectively defined on the first and the second end of the flat heat pipe 1 are flattened out and then sealed by welding, such that the first flatten-out zone 141 has a first remainder section 1411 and a first cut-away section 1412, whereas the second flatten-out zone 142 has a second remainder section 1421 and a second cut-away section 1422.

More specifically, the flat heat pipe 1 has a first and a second flatten-out zone 141, 142 defined on the first and the second end thereof, respectively, and two portions of the chamber 11 corresponding to the first and second flatten-out zones 141, 142 have not any wick structure provided therein and are defined as a first and a second wick-free space 181, 182. The first flatten-out zone 141 includes a first remainder section 1411 and a first cut-away section 1412, whereas the second flatten-out zone 142 includes a second remainder section 1421 and a second cut-away section 1422. In the illustrated second preferred embodiment, the first and the second flatten-out zone 141, 142 are portions of the flat heat pipe 1 that do not provide the function of heat transfer, and are normally referred to as ineffective portions of the flat heat pipe 1. The first flatten-out zone 141 is located corresponding to the first wick-free space 181 of the chamber 11 and a sealed reducing section 15 that is gradually outward reduced from the first end of the flat heat pipe 1, whereas the second flatten-out zone 142 is located corresponding to the second wick-free space 182 of the chamber 11 and a closed round end 16 that is formed on the second end of the flat heat pipe 1.

Figure 6B:
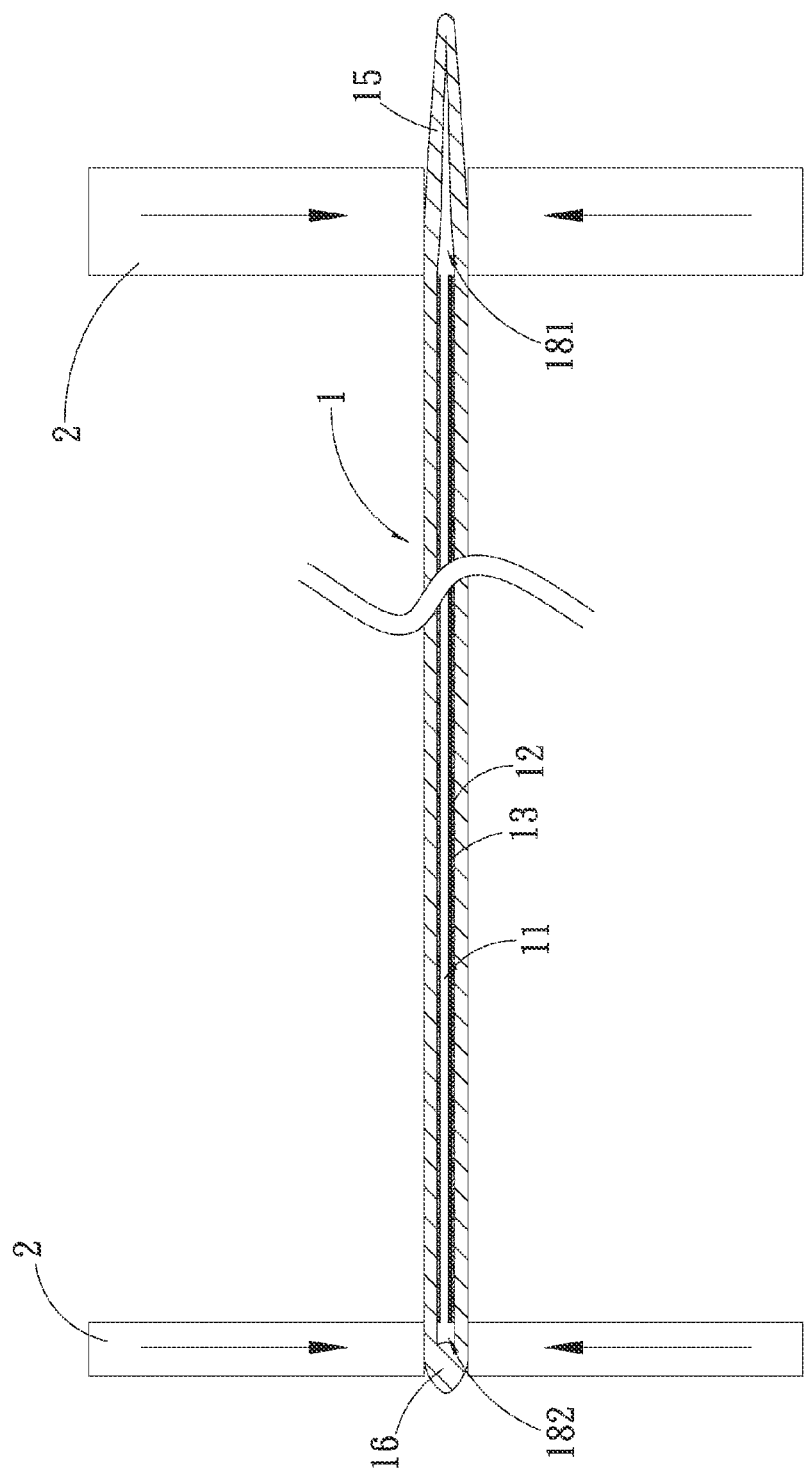
FIG. 6B is a sectional view showing the flat heat pipe of FIG. 6A before ineffective portions thereof are flattened out.

The first remainder section 1411 corresponds to a section of the first wick-free space 181 that is located adjacent to the wick structure 13, whereas the first cut-away section 1412 corresponds to the reducing section 15 and another section of the first wick-free space 181 that is located beyond the first remainder section 1411. The second remainder section 1421 corresponds to a section of the second wick-free space 182 that is located adjacent to the wick structure 13, whereas the second cut-away section 1422 corresponds to the closed round end 16 and another section of the second wick-free space 182 that is located beyond the second remainder section 1421. In the step 201, the first and the second flatten-out zone 141, 142 are respectively flattened out with a flattening device 2 and then undergone a low-temperature welding, such as a low-temperature high-frequency welding, to seal an inner wall surface thereof, as shown in FIGS. 6B and 6C. In the illustrated second preferred embodiment, the first and the second flatten-out zone 141, 142 can be flattened by squeezing, rolling, brake pressing, or pressing.

In the step 202, the flattened and sealed first and cut-away sections 1412, 1422 are cut away while the first and second remainder sections 1411, 1421 are reserved, so that two ineffective portions are removed from the flat heat pipe 1.

Figure 7:
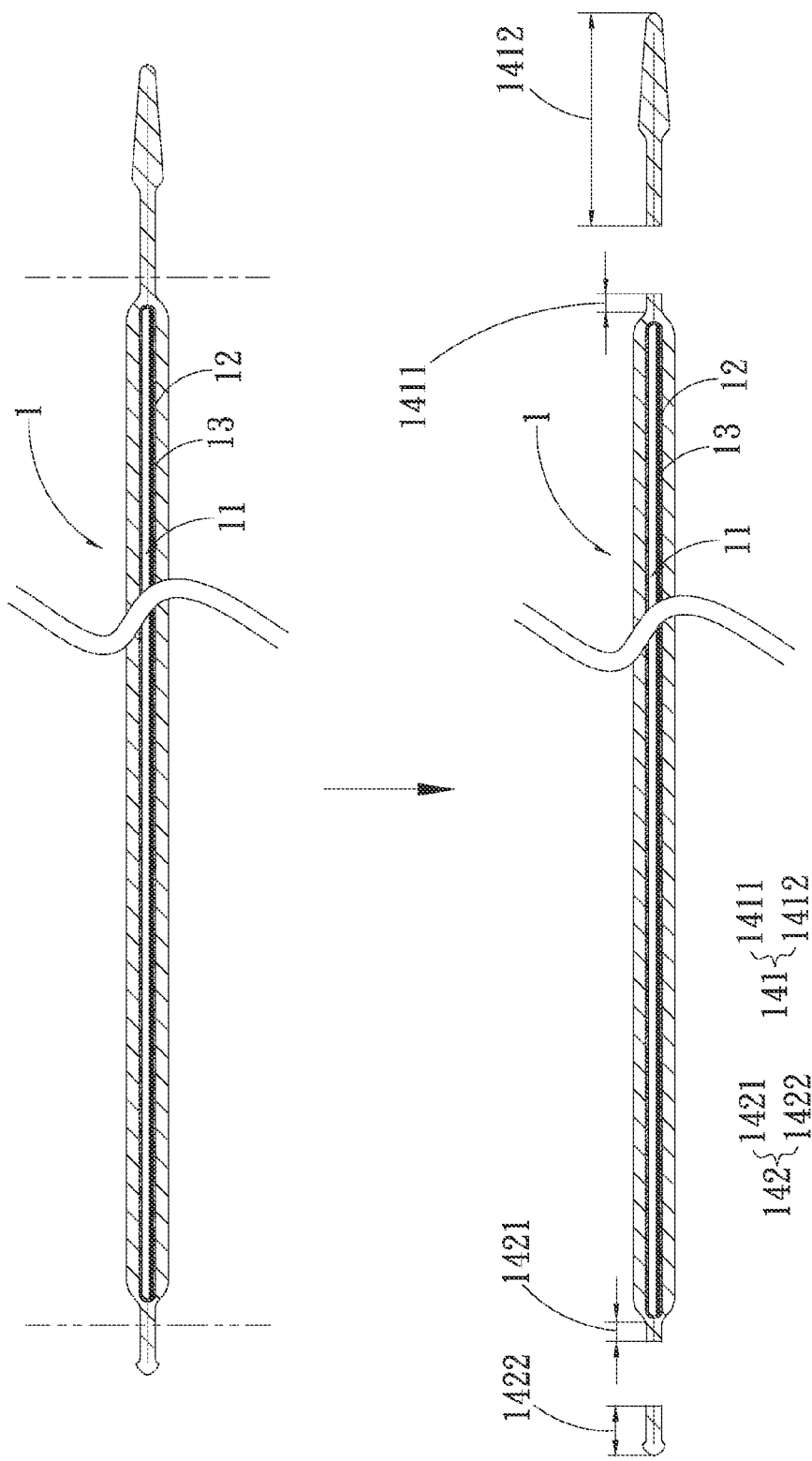
FIG. 7 shows the flat heat pipe of FIG. 6C is cut to remove cut-away sections therefrom.

More specifically, in the step 202, the flattened and sealed first and second cut-away sections 1412, 1422 are cut away but the first and second remainder sections 1411, 1421 are reserved, such that the sealed reducing section 15 and the closed round end 16, which are respectively formed on the first and the second end of the flat heat pipe 1 without providing the heat transfer function, are cut off, as shown in FIG. 7. In other words, surplus sections of the two ineffective portions, i.e. the first and the second cut-away section 1412, 1422, are removed to thereby shorten the ineffective potions of the flat heat pipe 1. Furthermore, the first and the second remainder section 1411, 1421 are shorter than the first and the second cut-away section 1412, 1422, respectively.

With the above method, the ineffective portions of the flat heat pipe 1 can be partially removed and effectively shortened, allowing the flat heat pipe 1 to have increased heat transfer efficiency. Furthermore, since the surplus sections of the ineffective portions of the flat heat pipe 1 are cut away, both of the sealed reducing section 15 and the closed round end 16 are removed to effectively shorten the ineffective portions, allowing the flat heat pipe 1 to have reduced length, volume and height. Therefore, the flat heat pipe 1 processed with the method of the present invention can save a lot of space and is suitable for use in a smart mobile device, such as a smart watch, a smartphone, a tablet PC, or other smart devices, to advantageously allow further reduction of the whole volume of the smart mobile device.

Figure 8:
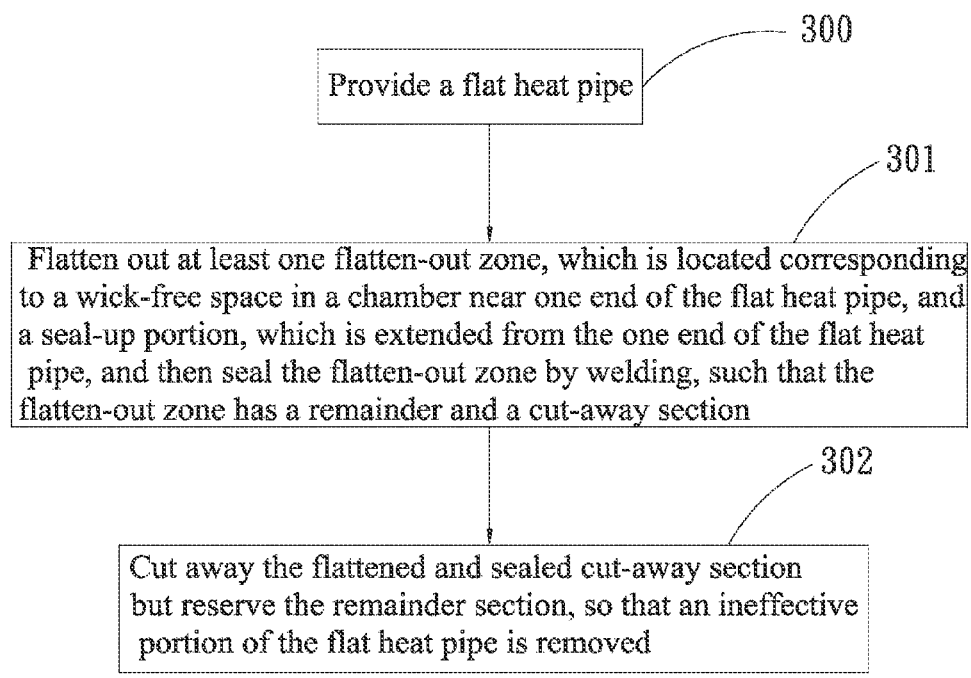
FIG. 8 is a flowchart showing the steps included in the method according to a third preferred embodiment of the present invention.
Figure 9:
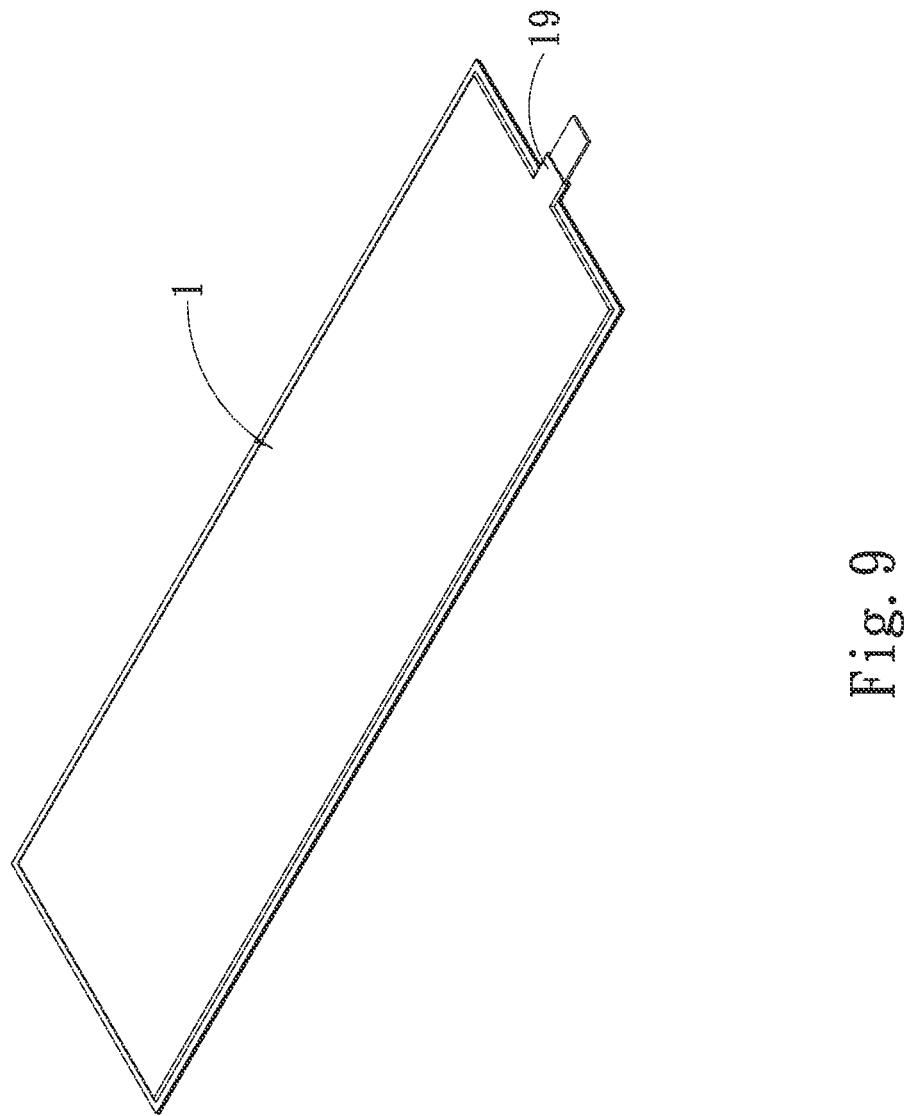
FIG. 9 is a perspective view of a flat heat pipe provided according to the method of FIG. 8.
Figure 10A:
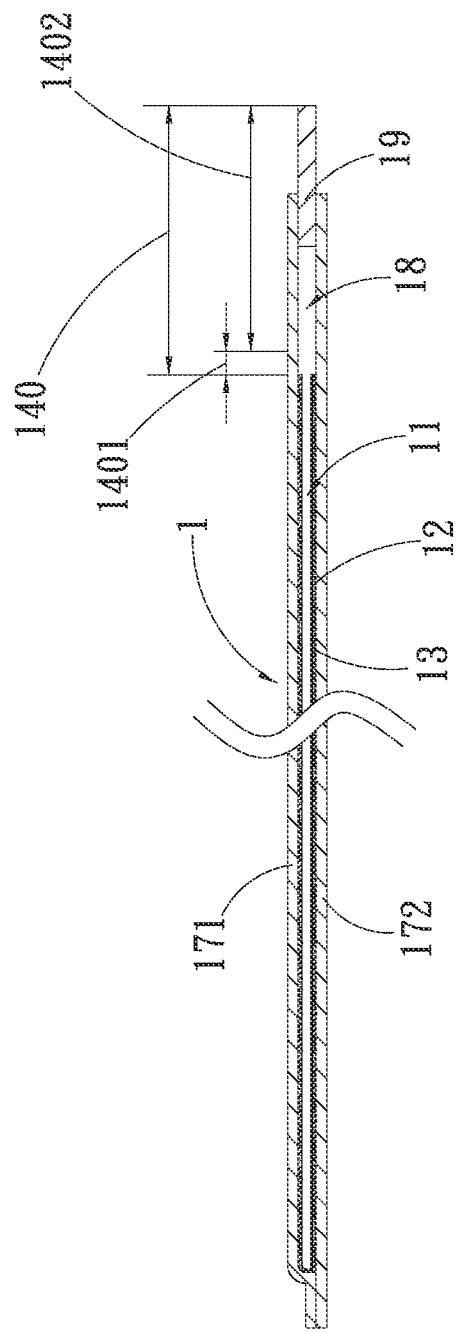
FIG. 10A is a sectional view of FIG. 9.
Figure 10B:
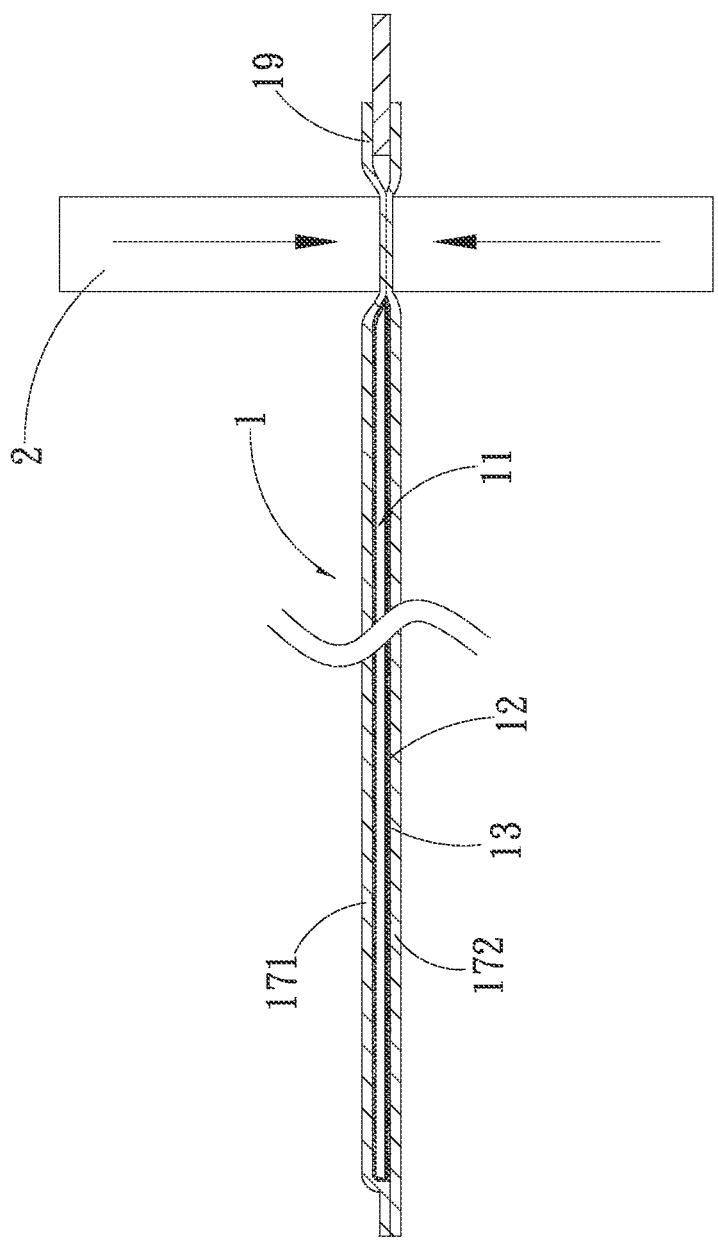
FIG. 10B shows the flat heat pipe of FIG. 10A after an ineffective portion thereof is flattened out.

Please refer to FIGS. 8, 9, 10A, 10B and 10C, wherein FIG. 8 is a flowchart showing the steps 300, 301 and 302 included in the method according to a third preferred embodiment of the present invention, FIGS. 9 and 10A are perspective and sectional views, respectively, of a flat heat pipe provided according to the method of FIG. 8, and FIGS. 10B and 10C are pictorial description of the method of FIG. 8. As shown, in the illustrated third preferred embodiment, an upper and a lower plate 171, 172 are closed to each other to provide a flat heat pipe 1.

In the step 300, a flat heat pipe 1 is provided. The flat heat pipe 1 internally defines a vacuum chamber 11, which is filled with a working fluid 12 and has at least one wick structure 13 formed on an inner wall surface thereof.

More specifically, in the step 300, an upper and a lower plate 171, 172 are closed to each other to provide a flat heat pipe 1, as shown is FIGS. 9 and 10A. The flat heat pipe 1 internally defines a vacuum chamber 11, which is filled with a working fluid 12, such as pure water, an inorganic compound, alcohols, ketones, a liquid metal, a refrigerant or an organic compound, and has at least one wick structure 13 formed on an inner wall surface thereof. In the illustrated third preferred embodiment, the wick structure 13 can be, but not limited to, a sintered powder structure. In practical implementation, the wick structure 13 can be grooves or metal meshes. A wick-free space 18 is defined in the flat heat pipe 1 between the wick structure 13 provided on the inner wall of the flat heat pipe 1 and one end of the flat heat pipe 1. The wick-free space 18 is not provided with any wick structure to facilitate easy filling of the working fluid 12 into the chamber 11 via the wick-free space 18. Therefore, the wick-free space 18 of the flat heat pipe 1 does not provide the function of heat transfer.

In the step 301, a flatten-out zone 140 defined on one end of the flat heat pipe 1 is flattened out and then sealed by welding, such that the flatten-out zone 140 has a remainder section 1401 and a cut-away section 1402.

More specifically, the flat heat pipe 1 has a flatten-out zone 140 located corresponding to the wick-free space 18 of the chamber 11 and a seal-up portion 19 extended from one end of the flat heat pipe 1. The flatten-out zone 140 includes a remainder section 1401 and a cut-away section 1402. In the illustrated third preferred embodiment, the flatten-out zone 140 is a portion of the flat heat pipe 1 that does not provide the function of heat transfer and is normally referred to as an ineffective portion of the flat heat pipe 1. The remainder section 1401 corresponds to a section of the wick-free space 18 that is located adjacent to the wick structure 13, whereas the cut-away section 1402 corresponds to the seal-up portion 19 and another section of the wick-free space 18 that is located beyond the remainder section 1401. In the step 301, a portion of the flatten-out zone 140 located between the wick structure 13 and the seal-up portion 19 is flattened out with a flattening device 2 and then undergone a low-temperature welding, such as a low-temperature high-frequency welding, to seal an inner wall surface thereof, as shown in FIG. 10B. In the illustrated third preferred embodiment, the flatten-out zone 140 can be flattened by squeezing, rolling, brake pressing, or pressing.

In the step 302, the flattened and sealed cut-away section 1402 is cut away while the remainder section 1401 is reserved, so that the ineffective portion is removed from the flat heat pipe 1.

More specifically, in the step 302, the flattened and sealed cut-away section 1402 is cut away but the remainder section 1401 is reserved, such that the seal-up portion 19 without heat transfer function is cut off, as shown in FIG. 10C. In other words, a surplus section of the ineffective portion, i.e. the cut-away section 1402, is removed to thereby shorten the ineffective potion of the flat heat pipe 1. Furthermore, the remainder section 1401 has a length smaller than that of the cut-away section 1402.

With the above method, the ineffective portion of the flat heat pipe 1 can be effectively shortened, allowing the flat heat pipe 1 to have largely increased heat transfer efficiency. Furthermore, the flat heat pipe 1 with shortened ineffective portion can save a lot of space and is suitable for use in a smart mobile device, such as a smart watch, a smartphone, a tablet PC or other smart devices, to advantageously allow further reduction of the volume of the smart mobile device.

In conclusion, the method of removing ineffective portion of flat heat pipe according to the present invention has the following advantages: (1) Enabling a flat heat pipe to have largely shortened ineffective portion; (2) enabling the flat heat pipe to have increased heat transfer efficiency; and (3) enabling the flat heat pipe to occupy less space.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A method of removing an ineffective portion of flat heat pipe, comprising the following steps:
   providing a flat heat pipe internally defining a vacuum chamber, which is filled with a working fluid and has at least one wick structure formed on an inner wall surface thereof so as to define a wick-containing space with the at least one wick structure extending an entire length of the wick-containing space and an adjacent wick-free space lacking the at least one wick structure;
   flattening out at least the wick-free space, and then sealing the flat heat pipe by welding, such that the flattened wick-free space defines a remainder section adjacent the wick-containing space and a cut-away section distal the wick-containing space; and
   cutting away the flattened and sealed cut-away section, so that the wick-free space of the flat heat pipe is removed and only the wick-containing space remains.

2. The method of removing an ineffective portion of flat heat pipe as claimed in claim 1, wherein the flat heat pipe is formed by flattening out a round heat pipe.

3. The method of removing an ineffective portion of flat heat pipe as claimed in claim 1, wherein the flatten-out zone is flattened out in a manner selected from the group consisting of squeezing, rolling, brake pressing, and pressing.

4. The method of removing an ineffective portion of flat heat pipe as claimed in claim 1, wherein the remainder section has a length smaller than that of the cut-away section.

* * * * *